(12) United States Patent
Vincent et al.

(10) Patent No.: US 11,619,681 B2
(45) Date of Patent: Apr. 4, 2023

(54) METHODS, DEVICES AND SYSTEMS FOR DETECTING AN ISOLATION FAULT IN AN ELECTRICAL INSTALLATION

(71) Applicant: Schneider Electric Industries SAS, Rueil-Malmaison (FR)

(72) Inventors: François Vincent, Le Cheylas (FR); Jiri Stepanek, Saint Martin d'heres (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 0 days.

(21) Appl. No.: 17/387,744

(22) Filed: Jul. 28, 2021

(65) Prior Publication Data

US 2022/0091191 A1    Mar. 24, 2022

(30) Foreign Application Priority Data

Jul. 24, 2020 (FR) ................................ FR 2007819

(51) Int. Cl.
  *G01R 31/52* (2020.01)
  *G01R 27/18* (2006.01)
  *G01R 31/08* (2020.01)

(52) U.S. Cl.
  CPC ............. *G01R 31/52* (2020.01); *G01R 27/18* (2013.01); *G01R 31/081* (2013.01)

(58) Field of Classification Search
  CPC ...... G01R 31/52; G01R 27/18; G01R 31/081; G01R 27/16; G01R 31/088; G01R 31/086
  USPC ........................................................ 324/537
  See application file for complete search history.

(56) References Cited

U.S. PATENT DOCUMENTS 5,140,492 A      8/1992  Schweitzer, III
2019/0190247 A1*  6/2019  Bernard ................... H02H 3/33

FOREIGN PATENT DOCUMENTS

| CN | 101526578 A | 9/2009 |
| EP | 1936393 A1 | 6/2008 |
| EP | 2006694 A1 | 12/2008 |
| FR | 2963679 A1 | 2/2012 |

OTHER PUBLICATIONS

French Search Report and Written Opinion dated Apr. 7, 2021 for corresponding French Patent Application No. 2007819, 7 pages.

* cited by examiner

*Primary Examiner* — Farhana A Hoque
(74) *Attorney, Agent, or Firm* — Locke Lord LLP

(57) ABSTRACT

A method for detecting an isolation fault in an electrical installation comprises:
  measuring an AC electrical voltage between phase conductors of an electrical load to be monitored and ground, and an electric fault current flowing between said electrical load and ground;
  identifying, in the measured electrical voltage, at least one first component oscillating at the predefined first frequency and one second component oscillating at the predefined second frequency;
  calculating an impedance of the electrical fault from the measurements and an impedance of the electrical installation from the identified first and second components;
  selecting a predetermined case from a predefined list; and
  identifying an operating condition of the electrical installation on the basis of the selected predetermined case.

10 Claims, 4 Drawing Sheets

METHODS, DEVICES AND SYSTEMS FOR DETECTING AN ISOLATION FAULT IN AN ELECTRICAL INSTALLATION

The present invention relates to methods and devices for detecting an isolation fault in an electrical installation, especially in the field of the distribution of electricity.

The invention is most particularly applicable to electrical installations in which the electrical phases and the neutral line are not connected to ground (installations employing an isolated ground (IG)).

In such installations, it is common to use a detecting system the aim of which is to detect and locate isolation faults resulting from an undesirable contact between one of the phases (or neutral) and ground.

In practice, when such a fault occurs in isolation, it poses no immediate threat to the installation, and hence it is not necessary to interrupt the electricity supply, provided that no other fault occurs. Once the fault has been located, an operator is deployed to remove the problem behind the fault.

For example, such detecting systems comprise an isolation monitor and locating devices that are connected to each electrical load supplied by the installation. Each of the locating devices is synchronized with the isolation monitor, for example by being connected thereto by a cable or by a communication link.

In certain installations, it may be desirable to not synchronize the isolation monitor with the locating devices, in order to simplify the installation.

However, the detecting system may then, under certain circumstances, generate false alarms, especially when the electrical current is low in magnitude and in the presence of certain electrical effects.

False alarms are unacceptable, because they cause personnel to be mobilized for no valid reason and may negatively affect the correct operation of the installation and of the apparatuses supplied thereby.

It is these drawbacks that the invention more particularly remedies by providing methods and devices for detecting an isolation fault in an electrical installation.

To this end, one aspect of the invention relates to a method for detecting an isolation fault in an electrical installation by means of a detecting device associated with an electrical load supplied by the electrical installation, the electrical installation comprising an isolation monitor configured to inject a measurement signal into the electrical installation, said injected signal comprising a first component oscillating periodically at a predefined first frequency and a second component oscillating periodically at a predefined second frequency, the electrical phases of the installation being normally isolated from ground, the method comprising steps consisting in:
  measuring an AC electrical voltage between phase conductors of the electrical load to be monitored and ground, and an electric fault current flowing between said electrical load and ground;
  identifying, in the measured electrical voltage, at least one first component oscillating at the predefined first frequency and one second component oscillating at the predefined second frequency;
  calculating an impedance of the electrical fault from the fault current measurements and from the measured electrical voltage;
  calculating an impedance of the electrical installation from the first and second components identified in the measured electrical voltage;
  selecting a predetermined case from a predefined list, depending on the calculated impedances, on the measured electrical voltage and on the measured fault current;
  identifying an operating condition of the electrical installation on the basis of the selected predetermined case.

According to some advantageous but inessential aspects, such a detecting method may incorporate one or more of the following features, which may be implemented alone or in any technically acceptable combination:
  The predetermined case is also chosen depending on the calculated values of the impedance of the electrical fault and of the impedance of the electrical installation.
  The step of selecting comprises a sub-step of verifying the calculated values of the impedance of the electrical fault and of the impedance of the electrical installation in order to detect an aberrant value.
  Each of the predetermined cases is associated with one or more fault current values and with one or more network voltage values that correspond to a specific state of the installation, and wherein the step of selecting the predetermined case comprises selecting said case that corresponds to the fault current and network voltage values measured beforehand.
  The calculated impedance value is displayed by the locating device and/or sent to a remote site by the locating device.
  The second frequency is an integer multiple of the first frequency.
  The second frequency is higher than the first frequency.
  Prior to the voltage measurement, a first apparatus connected between the electrical phase of the installation and ground injects a measurement signal into the installation, the injected signal comprising a component oscillating periodically at the first frequency and a component oscillating periodically at the second frequency.

According to another aspect, the invention relates to a device for detecting an isolation fault in an electrical installation. This device is configured to implement steps consisting in:
  measuring an AC electrical voltage between phase conductors of the electrical load to be monitored and ground, and an electric fault current flowing between said electrical load and ground;
  identifying, in the measured electrical voltage, at least one first component oscillating at a predefined first frequency and one second component oscillating at a predefined second frequency;
  calculating an impedance of the electrical fault from the fault current measurements and from the measured electrical voltage;
  calculating an impedance of the electrical installation from the first and second components identified in the measured electrical voltage;
  selecting a predetermined case from a predefined list, depending on the calculated impedances, on the measured electrical voltage and on the measured fault current; and
  identifying an operating condition of the electrical installation on the basis of the selected predetermined case.

The invention also relates to a system for detecting an isolation fault in an electrical installation, the electrical phases of the installation being normally isolated from ground, the detecting system comprising a first apparatus connected between an electrical phase of the installation and ground and a second apparatus associated with an electrical load supplied by the electrical installation, the detecting system being characterized in that the first apparatus is configured to inject a measurement signal into the installation. The injected signal comprises a first component oscillating periodically at a predefined first frequency and a second component oscillating periodically at a predefined second frequency. The second apparatus is according to the detecting device.

The invention will be better understood and other advantages thereof will become more clearly apparent from the following description of one embodiment of a method for detecting an isolation fault in an electrical installation, which description is given solely by way of example and with reference to the appended drawings, in which.

Figure 1:
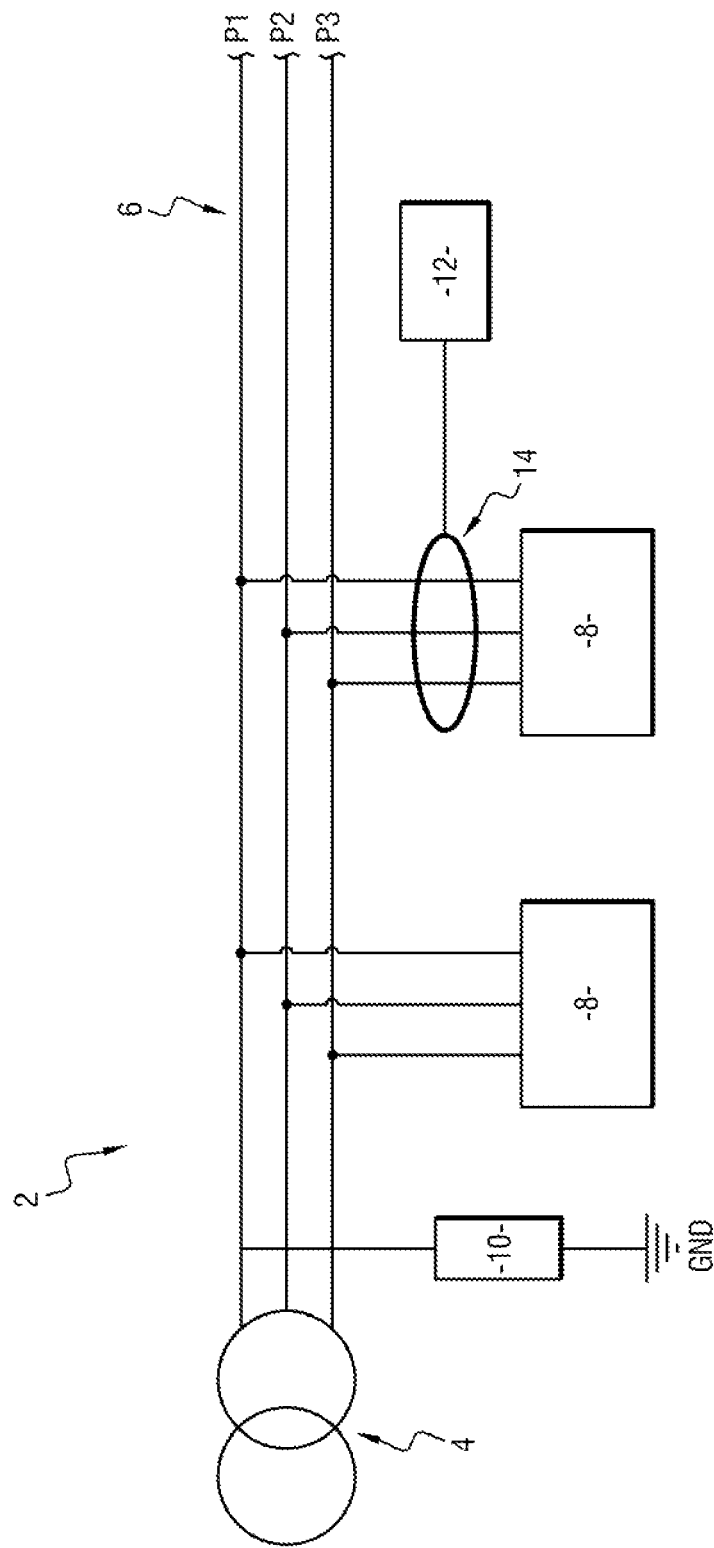
FIG. 1 is a schematic of an electrical installation comprising a system for detecting an isolation fault according to embodiments of the invention.

FIG. 1 schematically shows an electrical installation 2, such as a power distribution facility.

The installation 2 is supplied by an electrical source 4, such as a transformer connected to an upstream distribution network, or a generator.

The installation 2 comprises one or more electrical conductors 6 that serve to convey an electrical current, especially a polyphase current such as a three-phase current.

In the illustrated example, the conductors 6 are respectively associated with electrical phases P1, P2 and P3, or even with a neutral line (not illustrated in FIG. 1).

Below, the conductors 6, whether they are associated with the phases P1, P2, P3 or with the neutral N, may be referred to as "phase conductors" or "active conductors".

One or more electrical loads 8 are connected to the conductors 6 and are supplied electrically by the installation 2. For example, the electrical loads 8 are electric motors, or industrial machines, or heating systems, these examples being non-limiting.

For example, the electrical loads 8 are connected to the conductors 6 by means of connections or stubs.

Preferably, in the installation 2, the electrical phases P1, P2 and P3 (and the neutral line if the latter is present) are not connected to ground under normal operating conditions. Such an installation 2 is said to employ an isolated ground (IG).

The installation 2 also comprises a detecting system configured to detect an isolation fault, especially isolation faults resulting from an undesirable contact between one of the phases (or neutral) and ground.

The detecting system comprises a first apparatus 10, also called the isolation monitor 10, and at least a second apparatus 12, called the locating device 12, or detecting device.

Figure 2:
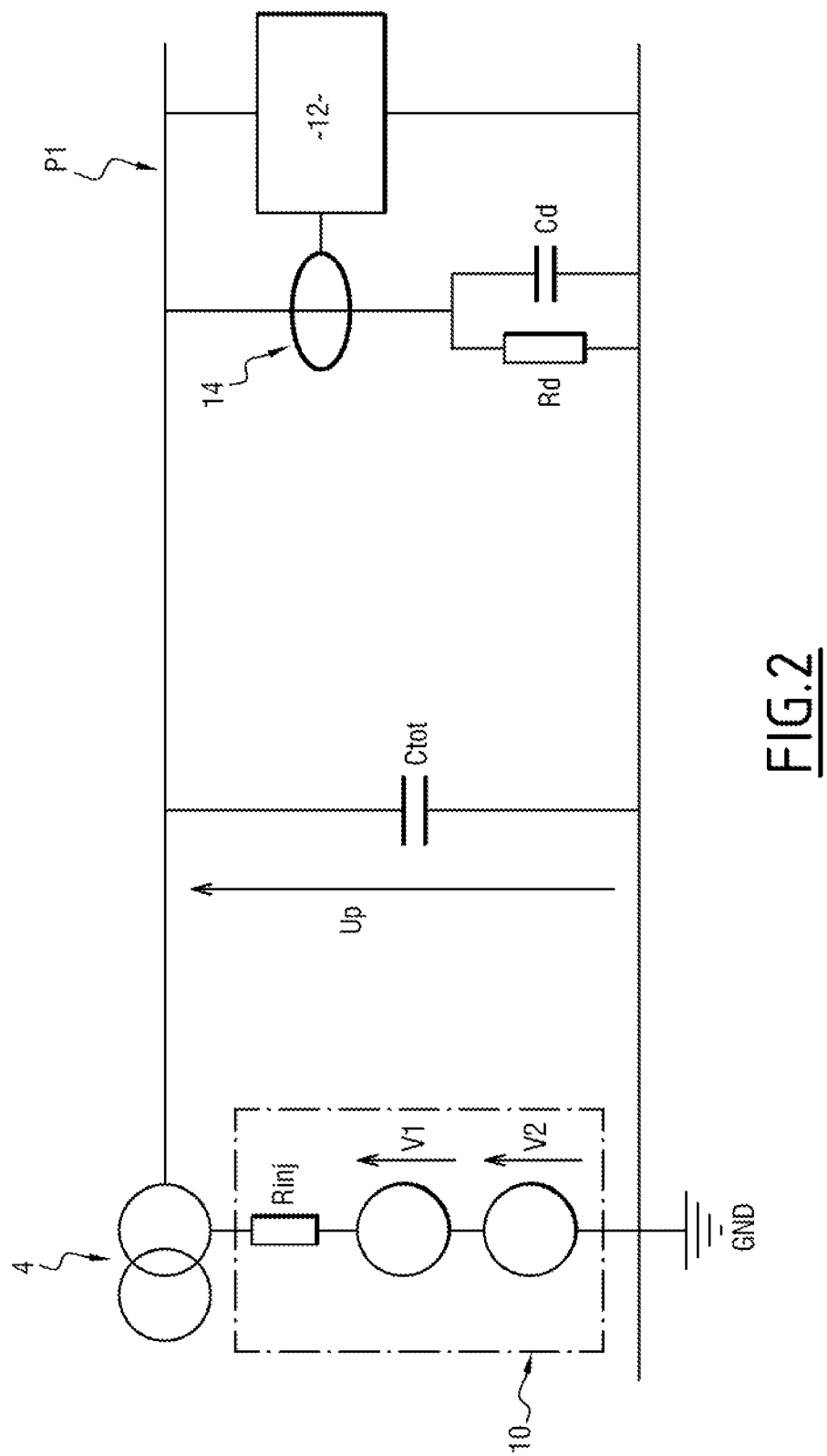
FIG. 2 is a simplified schematic of a segment of the electrical installation and of the detecting system of FIG. 1.

FIG. 2 illustrates an example of implementation of the detecting system.

The isolation monitor 10 is connected between the conductors 6 and ground, preferably to the source 4. In FIGS. 1 and 2, ground is represented by the symbol GND.

To simplify FIG. 2, the isolation monitor 10 is illustrated connected to a single phase P1. In practice, however, the isolation monitor 10 may be connected to each of the electrical phases and may monitor each of these phases independently. It will therefore be understood that the description that is given below with reference to the single phase P1 may be generalized to all the phases.

The isolation monitor 10 is configured to inject a measurement electrical current into the installation 2, which current is also referred to as "injected signal" below.

For example, the isolation monitor 10 comprises a voltage generator and a resistance $R_{inj}$ that is connected between the phase P1 to be monitored and ground GND. The measurement current is injected into the phase P1 by generating and applying an electrical voltage between the phase P1 and ground GND.

In practice, the current injected by the isolation monitor 10 is superposed on the polyphase current delivered by the source 4.

According to exemplary embodiments, the voltage generated by the isolation monitor 10 comprises at least one AC component that comprises a first component V1 oscillating periodically at a first frequency f1 and a second component V2 oscillating periodically at a second frequency f2.

For example, the second frequency f2 is higher than the first frequency f1.

Preferably, the second frequency f2 is an integer multiple of the first frequency f1. This makes the injected signal easier to measure subsequently, since the two components V1 and V2 may be measured at the same sampling rate.

According to one example, which is given for the sake of illustration, the first frequency is equal to 1.25 Hz and the second frequency f2 is equal to 2.5 Hz.

In particular, the components V1 and V2 are attenuated differently during the propagation of the signal injected into the installation 2, this in the end allowing the injected signal to be better detected and the impedance of the installation 2 to be measured more accurately.

As a variant, one or more other additional components oscillating at different frequencies could be added to the voltage generated by the isolation monitor 10. The corresponding frequencies are then preferably higher than the second frequency f2 and are multiples of the frequency f2.

The voltage generated by the isolation monitor 10 may also comprise a DC component, for example in order to make the generated voltage more symmetric.

Preferably, the maximum amplitude of the generated voltage is lower than 120 V.

In many embodiments, the isolation monitor 10 comprises a control device implemented via one or more electronic circuits.

For example, the control device comprises a processor, such as a programmable microcontroller or a microprocessor. The processor is coupled to a computer memory, or to any computer-readable data storage medium that contains executable instructions and/or software code.

As a variant, the control device may comprise a signal processor (DSP), or a reprogrammable logic component (FPGA), or an application-specific integrated circuit (ASIC), or any equivalent element.

In practice, the isolation monitor 10 may also determine the overall impedance of the installation 2 and thus determine whether or not an isolation fault has appeared on the scale of the installation 2. However, this does not allow the precise location of the fault in the installation 2 to be determined, and hence it is then useful, in addition, to make recourse to the locating devices 12.

Each locating device 12 is connected to an electrical load 8 to be monitored. Preferably, a locating device 12 is associated with each electrical load 8 supplied by the installation 2.

Each locating device 12 comprises a measuring device 14 for measuring an electrical fault current flowing between the monitored load 8 and ground, and more exactly, between the phase conductors connecting this electrical load 8 and ground.

For example, a current sensor, such as a measurement torus or equivalent, is coupled to the connection via which the load 8 is connected to the conductors 6.

The locating device 12 is also configured to measure the electrical voltage, called the network voltage, or line voltage (denoted Up below), between the electrical phases and ground, for example by means of a voltage sensor connected between one of the electrical phases of the load 8 (here the phase P1) and ground.

The network voltage Up is, for example, set by the isolation monitor 10.

Preferably, the locating device 12 is configured to measure the vector sum of all the phase (and neutral, where appropriate) currents flowing through the phase conductors associated with the monitored electrical load 8.

To simplify FIG. 2, a single locating device 12, associated with the single phase P1, has been illustrated. Just as above, as a variant, the locating device 12 may be connected to each of the electrical phases and may monitor the electrical load 8. Once again, everything that has been explained with reference to the single phase P1 may be generalized to all the electrical phases of the installation.

In practice, the leakage impedance of the entire electrical load 8 (and therefore for all the phase conductors associated with this electrical load 8) may be monitored with the locating device 12.

For example, this monitoring may be made possible by the fact that the signal sent by the isolation monitor 10 propagates from the point of injection to all the phase conductors through the source 4, because the internal impedance of the source 4, seen by the isolation monitor 10, is low with respect to the impedance of the electrical installation 2.

In the illustrated example, an isolation fault between the phase P1 and ground GND has been represented by a fault impedance Zd comprising a fault resistance Rd connected in parallel with a fault capacitance $C_d$ between the phase P1 and ground GND. The total capacitance of the installation 2 (here for the monitored electrical phase P1) has been represented by an overall capacitance $C_{tot}$.

In many embodiments, each locating device 12 comprises a control device implemented via one or more electronic circuits.

For example, the control device comprises a processor, such as a programmable microcontroller or a microprocessor.

The processor is coupled to a computer memory, or to any computer-readable data storage medium, that contains executable instructions and/or software code intended to implement a method for detecting an electrical fault when these instructions are executed by the processor.

As variants, the control device may comprise a signal processor (DSP), or a reprogrammable logic component (FPGA), or an application-specific integrated circuit (ASIC), or any equivalent element.

Preferably, each locating device 12 comprises a user interface, for example comprising a display screen and/or indicator lights, allowing a warning message, or a diagnostic message, or even one or more calculated or measured electrical quantities, to be displayed.

In certain variants, each locating device 12 may comprise a communication interface allowing data to be sent to a remote piece of equipment, such as a server or a programmable logic monitor.

According to some embodiments, the communication interface may be of wired type, for example in order to allow a connection to a wired databus, such as a databus compatible with the Modbus standard.

In other embodiments, the communication interface may be a wireless communication interface, for example in order to set up a short-range radio link.

Preferably, the locating devices 12 are independent of the isolation monitor 10, i.e. they are not directly connected to the isolation monitor 10. In particular, the locating devices 12 are not synchronized with the isolation monitor 10. The absence of synchronization makes the detecting system simpler for the user to install and manage.

Figure 4:
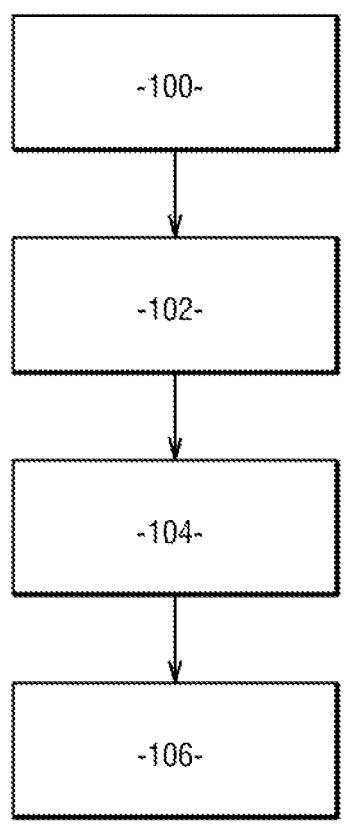
FIG. 4 is a flowchart of a method for detecting an isolation fault in an electrical installation according to some embodiments.

Generally, as illustrated by the schematic of FIG. 4, each of the locating devices 12 is configured to:
measure a fault current between the electrical load 8 to be monitored and ground GND, and to measure the network voltage Up between the phase conductors of the load 8 to be monitored and ground (step 100);
calculating the impedance Zd of the electrical fault from the fault current measurements and from the network voltage (step 102);
calculating the total impedance Zg of the installation 2 on the basis of the measurements of the network voltage, and on the basis of knowledge of the parameters of the signal injected by the isolation monitor 10, especially the frequencies f1 and f2 and the maximum amplitudes of the first voltage V1 and of the second voltage V2 (step 102);
automatically selecting a predetermined case depending on the measured network voltage and on the measured fault current (step 104), or even also depending on the impedance Zd of the electrical fault and on the overall impedance Zg of the installation that were measured beforehand;
identifying a condition of the installation 2, especially a fault condition or a normal operating condition, on the basis of the selected case (step 106).

In certain variants, certain ones of the steps described above could be executed in a different order, or even be omitted or replaced by functionally equivalent steps. The described example does not prevent, in other embodiments, other steps from being implemented conjointly and/or sequentially with the described steps.

For example, in step 100, the line voltage measured by the locating device 12 at least partially reflects the signal injected by the isolation monitor 10, and thus contains a periodic first component oscillating at the first frequency f1 and a second component oscillating at the second frequency f2.

According to examples, these two components may be measured via synchronous detection, given that the values of the first and second frequencies f1 and f2 are known in advance by the locating device 12. For example, these values are stored in a memory of the locating device 12.

Since the first and second voltages V1 and V2 and the value of the injection resistance $R_{inj}$ of the isolation monitor 10 are known, it is possible to determine the impedance Zg of the installation 2 without necessarily knowing the phase shift of the signal injected by the isolation monitor 10 with respect to the current measured by the locating device 12.

In other words, each locating device 12 is capable of determining the impedance Zg without needing to obtain this information in real time from the isolation monitor 10. The detecting system is therefore simpler (and less expensive) to manufacture and simpler to implement. It will be noted here that, in the variants in which the signal injected by the isolation monitor 10 comprises other different frequency components in addition to the first and second components, as envisaged above, the locating device 12 may advantageously be configured to also take into account these additional components and their corresponding frequencies when determining the impedance Zg of the installation 2.

In addition, by calculating the impedance Zg of the installation 2 locally by means of the locating device 12, it is possible to detect an anomaly in the operation of the locating device 12, for example if the latter calculates an aberrant value for the impedance Zg (this would be impossible to do if the overall impedance were calculated by the isolation monitor 10 then simply transmitted to the locating device 12).

According to some modes of implementation, in step 102, the impedance Zg of the installation 2 is calculated using the following formula:

$$\frac{1}{Zg} = \frac{1}{Rg} + j \cdot 2\pi \cdot fr \cdot Cg$$

where Rg is the real part of the impedance Zg, corresponding to the overall resistance of the installation 2, Cg is the imaginary part of the impedance Zg, corresponding to the overall capacitance of the installation 2, fr is the network frequency (here equal to 50 Hz) and "j" is the imaginary unit.

For example, the overall capacitance Cg is calculated by means of the following formula:

$$Cg = \frac{1}{2\pi \cdot f1 \cdot \sqrt{q^2 - 1}} \cdot \sqrt{\frac{\left(\frac{U2}{Rinj}\right)^2}{U_{d2r}^2 + U_{d2i}^2} - \frac{\left(\frac{U1}{Rinj}\right)^2}{U_{d1r}^2 + U_{d1i}^2}}$$

where "q" is the ratio between the second frequency f2 and the first frequency f1, $R_{inj}$ is the injection resistance of the isolation monitor 10, U1 and U2 are the maximum amplitudes of the first and second components of the voltage generated by the isolation monitor 10, respectively, $U_{d1r}$ and $U_{d2r}$ are the real parts of the maximum amplitudes of the first and second components of the line voltage measured by the locating device 12, respectively, and $U_{d1i}$ and $U_{d2i}$ are the imaginary parts of the maximum amplitudes of the first and second components of the line voltage measured by the locating device 12, respectively.

In practice, the values of the amplitudes U1, U2 and of the injection resistance $R_{inj}$ are known in advance and may be stored in a memory of the locating device 12, for example in the factory or during commissioning of the installation 2.

For example, the resistance Rg is calculated by means of the following formula:

$$Rg = \frac{1}{\sqrt{\frac{1}{q^2 - 1} \cdot \left[\frac{q^2\left(\frac{U1}{Rinj}\right)^2}{U_{d1r}^2 + U_{d1i}^2} - \frac{\left(\frac{U2}{Rinj}\right)^2}{U_{d2r}^2 + U_{d2i}^2}\right] - \frac{1}{Rinj}}}$$

where "q" is the ratio between the second frequency f2 and the first frequency f1, $R_{inj}$ is the injection resistance of the isolation monitor 10, U1 and U2 are the maximum amplitudes of the first and second components of the voltage generated by the isolation monitor 10, respectively, $U_{d1r}$ and $U_{d2r}$ are the real parts of the maximum amplitudes of the first and second components of the line voltage measured by the locating device 12, respectively, and $U_{d1i}$ and $U_{d2i}$ are the imaginary parts of the maximum amplitudes of the first and second components of the line voltage measured by the locating device 12, respectively.

In practice, the sum of the squares $U_{d1r}^2 + U_{d1i}^2$ is equal to the square of the amplitude of the first frequency component f1 of the measured line voltage, which may be obtained from the measured voltage (RMS amplitude). The same goes for the sum $U_{d2r}^2 + U_{d2i}^2$ with respect to the second frequency component f2.

According to some embodiments, in step 102, the impedance Zr of the fault is calculated on the basis of the fault current measured by the sensor 14 and of the line voltage.

Figure 3:
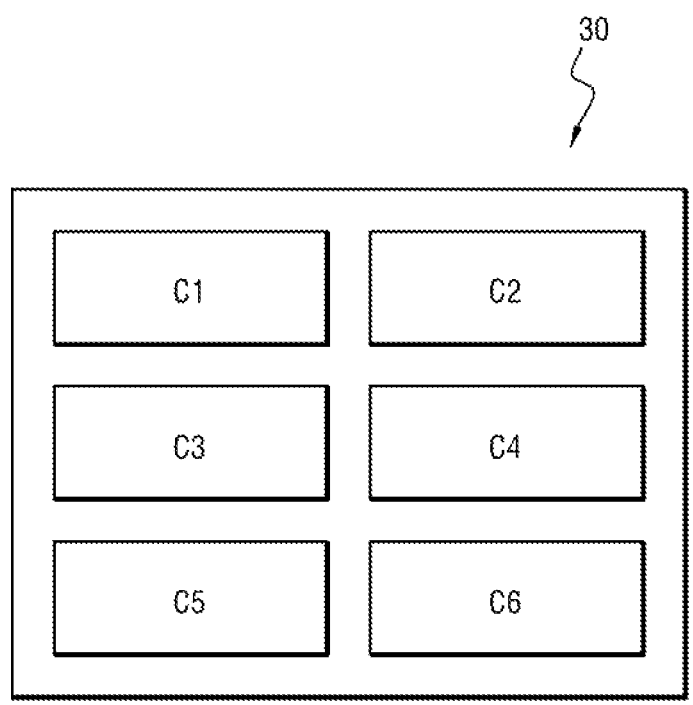
FIG. 3 is a simplified schematic of a database used by the detecting system of FIG. 2.

FIG. 3 schematically shows a list 30 containing a plurality of predetermined cases, which in the illustrated example are denoted C1 to C6. In practice, the number of predetermined cases stored in the table may be different from six. In the example described below, nine cases are predefined, this number being able to be tailored to the circumstances.

For example, the list 30 may be stored in the memory of the locating device 12 in any suitable form, for example in the form of a table, or of a database, or of any equivalent data structure.

Each of the predetermined cases is associated with one or more values (for example a first interval of values) of fault current and with one or more values (for example a second interval of values) of network voltage that correspond to a specific state of the installation, such as a normal operating condition or an isolation fault condition, for example.

In other words, each of the predetermined cases is indexed by values of fault current and of network voltage. For example, one predetermined case is associated with each combination of intervals of fault current and of measured line voltage.

For example, each of the predetermined cases may be defined by the manufacturer during the manufacture of the locating device 12, or by an installer during the commissioning of the locating device 12 in the installation 2. The predefined list 30 is then stored in memory at that point in time.

In step 104, one of the predetermined cases is selected by identifying the predetermined case the voltage and current values of which correspond to those measured in step 102. Step 106 then consists in retaining as diagnosis the condition associated with this selected predetermined case.

In step 106, the result of the diagnosis may be sent to a remote site and/or displayed locally via the interface of the locating device 12, for example by activating one or more indicator lights and/or by displaying a message or symbol on the display screen.

Preferably, the calculated total impedance value Zg is displayed on the display screen of the locating device 12. Advantageously, the calculated value of the impedance Zd of the fault is displayed on the display screen of the locating device 12.

In certain embodiments, each of the predetermined cases is also associated with one or more values of overall impedance Zg and/or of fault impedance Zd.

Preferably, step 104 comprises a verifying sub-step in order to detect whether the values calculated beforehand of the impedance Zd of the fault and of the total impedance Zg have an aberrant value indicating a failure of the detecting system or a calculation error or a measurement error.

For example, the values of total impedance Zg and of fault impedance Zd are compared with each other. If the total impedance Zg of the entire installation 2 is higher than the impedance Zd of the fault, then the situation is considered to be an aberrant one resulting from a calculation error, or from a measurement error, or from a malfunction of the detecting system.

In the case where such an aberrant value is identified, the method may be interrupted. A specific warning message may be displayed and/or sent by the locating device 12. As a variant, the locating device 12 may inhibit the display of the calculated fault impedance value and/or of the calculated total impedance value Zg in order not to mislead any operators who consult the display screen.

This verifying sub-step may be implemented at the start of step 104, or indeed only after a predetermined case has been selected from the measured voltage and current values.

According to one more general example given for the sake of illustration, the list 30 contains nine predetermined cases, which are defined as follows.

Three intervals of values of fault current Id (for example lower than 0.1 mA, higher than 1 mA and comprised between 0.1 mA and 1 mA) and three intervals of values of line voltage UP (for example lower than 100 mV, higher than 5 V and comprised between 0.1 V and 5 V) are defined and one predetermined case is associated with each combination of these intervals, as summarized in the table below.

TABLE 1

|  | Up ≤ 100 mV | 100 mV < Up < 5 V | Up ≥ 5 V |
|---|---|---|---|
| Id ≤ 0.1 mA | Case 1 | Case 2 | Case 3 |
| 0.1 mA < Id < 1 mA | Case 4 | Case 5 | Case 6 |
| Id ≥ 1 mA | Case 7 | Case 8 | Case 9 |

In this example, for cases 1 and 2, the current is low, this tending to indicate that the fault is therefore probably not located near this locating device 12. However, the line voltage Up is low, probably because of an isolation fault elsewhere in the installation. The diagnosis associated with these cases therefore corresponds to the absence of a fault in this location.

For case 3, the voltage is high enough, but the amplitude of the current is low, this indicating that the fault is probably not located in this location. The associated diagnosis therefore corresponds to the absence of a fault in this location.

In light of the values in question, the ratio of the voltage value to the current value should give a fault impedance Zd higher than the overall impedance Zg.

If however the verification of the values of Zg and Zd carried out in this step 104 indicates that the fault impedance Zd is in fact lower than the overall impedance Zg, then the diagnosis associated with this case is ignored and a malfunction is considered to have occurred.

For case 4, the voltage is too low with respect to the expected value, probably because of a fault elsewhere in the installation. The current signal has a medium amplitude, indicating that the fault may be located at least partially in the load 8 associated with the locating device 12.

Cases 5 and 6 correspond to a normal case of the operation of the installation 2, in which an average isolation fault is detected in the monitored electrical load 8. Once again, the total impedance Zg should not be higher than the impedance Zd of the fault, except in case of failure of the locating device 12.

Cases 7 and 8 correspond to a case where an isolation fault affects the installation 2 and is probably located in the monitored load.

Case 9 is indicative of a highly disrupted installation 2. Reaching these conditions is theoretically not possible except in case of false measurement. Even if the impedance Zd of the fault is evaluated as higher than the total impedance Zg, its value is not reliable, and the customer should be warned.

Once again, this example is non-limiting and the predefined cases could be defined differently, depending on the specificities of the installation 2.

By virtue of the invention, the locating devices 12 allow an isolation fault in the installation 2 to be effectively located without needing to be synchronized with the isolation monitor 10. Despite this absence of synchronization, the method allows the condition of the installation (fault or normal operation) to be identified while limiting the occurrence of false alarms.

Specifically, in certain installations, the nature of the electrical load 8 and the way in which it is driven are sometimes liable to cause a false positive to be wrongly detected by the locating device 12. Such behaviour has, for example, been able to be observed with an industrial tool supplied by trains of current pulses at low frequency (close to 1 Hz). In the absence of synchronization between the isolation monitor 10 and the locating device 12, the latter would confuse these current pulses with the signal injected by the isolation monitor 10, because of a similarity between these signals.

By carrying out the diagnosis on the basis of predetermined cases that are selected depending on the measured current and voltage and on calculated impedances, the detecting device 12 may take into account specificities specific to each electrical installation.

Existing detecting devices 12 may thus be reparametrized and their operation may be adapted without needing to modify the architecture of the entire detecting system, and without needing to add a synchronization with the isolation monitor 10, because a synchronization is neither suitable nor desirable for certain installations.

Lastly, the fact of calculating the total impedance Zg with the detecting devices 12, rather than carrying out the calculation with the isolation monitor 10 then sending it to the detecting devices 12, allows a failure of the detecting device 12 to be detected.

Any feature of one of the embodiments or variants described above may be implemented in the other described embodiments and variants.

The invention claimed is:

1. A method for detecting an isolation fault in an electrical installation by means of a detecting device associated with an electrical load supplied by the electrical installation, the electrical installation comprising an isolation monitor configured to inject a measurement signal into the electrical installation, said injected signal comprising a first component oscillating periodically at a predefined first frequency and a second component oscillating periodically at a predefined second frequency, the electrical phases of the installation being normally isolated from ground, the method comprising:

measuring an AC electrical voltage between phase conductors of the electrical load to be monitored and ground, and an electric fault current flowing between said electrical load and ground;

identifying, in the measured electrical voltage, at least one first component oscillating at the predefined first frequency and one second component oscillating at the predefined second frequency;

calculating an impedance of the electrical fault from the fault current measurements and from the measured electrical voltage;

calculating an impedance of the electrical installation from the first and second components identified in the measured electrical voltage;

selecting a predetermined case from a predefined list, depending on the calculated impedances, on the measured electrical voltage and on the measured fault current; and identifying an operating condition of the electrical installation on the basis of the selected predetermined case.

2. The method according to claim 1, wherein the predetermined case is also chosen depending on the calculated values of the impedance of the electrical fault and of the impedance of the electrical installation.

3. The method according to claim 1, wherein selecting the predetermined case comprises verifying the calculated values of the impedance of the electrical fault and of the impedance of the electrical installation in order to detect an aberrant value.

4. The method according to claim 1, wherein each of the predetermined cases is associated with one or more fault current values and with one or more network voltage values that correspond to a specific state of the installation, and wherein selecting the predetermined case comprises selecting said case that corresponds to the fault current and electrical voltage values measured beforehand.

5. The method according to claim 1, wherein the calculated impedance value is displayed by the locating device and/or is sent to a remote site by the locating device.

6. The method according to claim 1, wherein the second frequency is an integer multiple of the first frequency.

7. The method according to claim 1, wherein the second frequency is higher than the first frequency.

8. The method according to claim 1, wherein, prior to the voltage measurement, a first apparatus connected between the electrical phase of the installation and ground injects a measurement signal into the installation, the injected signal comprising a component oscillating periodically at the first frequency and a component oscillating periodically at the second frequency.

9. A device for detecting an isolation fault in an electrical installation, wherein the device is configured to implement:

measuring an AC electrical voltage between phase conductors of the electrical load to be monitored and ground, and an electric fault current flowing between said electrical load and ground;

identifying, in the measured electrical voltage, at least one first component oscillating at a predefined first frequency and one second component oscillating at a predefined second frequency;

calculating an impedance of the electrical fault from the fault current measurements and from the measured electrical voltage;

calculating an impedance of the electrical installation from the first and second components identified in the measured electrical voltage;

selecting a predetermined case from a predefined list, depending on the calculated impedances, on the measured electrical voltage and on the measured fault current; and identifying an operating condition of the electrical installation on the basis of the selected predetermined case.

10. A system for detecting an isolation fault in an electrical installation, the electrical phases of the installation being normally isolated from ground, the detecting system comprising a first apparatus connected between an electrical phase of the installation and ground and a second apparatus associated with an electrical load supplied by the electrical installation, the detecting system being characterized in that the first apparatus is configured to inject a measurement signal into the installation, said injected signal comprising a first component oscillating periodically at a predefined first frequency and a second component oscillating periodically at a predefined second frequency, and in that the second apparatus is according to the detecting device of claim 9.

* * * * *